United States Patent
Im et al.

[11] Patent Number: 5,995,422
[45] Date of Patent: Nov. 30, 1999

[54] REDUNDANCY CIRCUIT AND METHOD OF A SEMICONDUCTOR MEMORY DEVICE

[75] Inventors: Heung-Soo Im, Seoul; Sang-Ki Hwang; Hyong-Gon Lee, both of Suwon, all of Rep. of Korea

[73] Assignee: Samsung Electronics Co., Ltd., Suwon, Rep. of Korea

[21] Appl. No.: 08/544,439

[22] Filed: Nov. 17, 1995

[30] Foreign Application Priority Data

Nov. 17, 1994 [KR] Rep. of Korea ............ 94-30259

[51] Int. Cl.⁶ ........................................ G11C 7/00
[52] U.S. Cl. ............................ 365/200; 365/225.7
[58] Field of Search ........................ 365/200, 225.7

[56] References Cited

U.S. PATENT DOCUMENTS 5,258,953 11/1993 Tsujimoto .......................... 365/200
5,379,259 1/1995 Fujita ................................. 365/200
5,414,659 5/1995 Ito ..................................... 365/200
5,416,740 5/1995 Fujita et al. ...................... 365/200

*Primary Examiner*—David C. Nelms
*Assistant Examiner*—Hien Nguyen
*Attorney, Agent, or Firm*—Cushman Darby & Cushman, IP Group of Pillsbury Madison & Sutro LLP

[57] ABSTRACT

The present invention provides a redundancy circuit in a semiconductor memory device which has spare memory cells which can store information that can be substituted for data of defective memory cells after the completion of the manufacturing process. If addresses designating the defective memory cells are externally input, the redundancy circuit generates a defective cell relief address signal which corresponds to the address designating the defective memory cell and is used to prevent defective data stored in normal memory cells from being output and causes correction data, to be substituted for the defective data output in correspondence with the defective cell relief address.

16 Claims, 4 Drawing Sheets

REDUNDANCY CIRCUIT AND METHOD OF A SEMICONDUCTOR MEMORY DEVICE

BACKGROUND OF THE INVENTION

The present invention relates to a semiconductor memory device and method of using the same, and more particularly a redundancy circuit of a semiconductor memory device having spare memory cells in which store information for substituting data of defective memory cells.

Recently, integration density and capacity of memory cells has increased in semiconductor memory devices, chip size has also increased. However, increased chip size has caused the yield of semiconductor chips to be reduced. Yields have further decreased as design rules become narrower in order to achieve a high integration density.

One of the most important ways of increasing yields is by using techniques for relieving defective cells. An Error Correction Code (hereinafter, referred to as ECC) is one of the defective cell relief techniques and utilizes a hamming code such as is generally used in digital telecommunication. Data having an error that is generated among data read from the memory cells can be substituted for the correct data using the data read from the memory cells and parity data. Defects in the memory cells and the error on data reading process can thus typically be corrected.

However, drawbacks to using an ECC (Error Correction Code), exist, such as undesirable increases in the area of the chip and certain errors still may not be corrected.

Another of the defective cell relief techniques uses spare memory cells along with the normal memory cells. In this technique, defective memory cells that exist among the normal memory cell array can be substituted with the spare memory cells when the normal memory cells are found to be defective. This redundancy technique is primarily used in DRAM (dynamic RAM), SRAM (static RAM) and PROM (programmable ROM) memory devices.

This redundancy technique has not been generally used in Mask ROMs, however, because that data in Mask ROM memory cells is stored during the time the Mask ROM device is manufactured (i.e., fabricated), prior to its being delivered to the user and/or buyer, unlike other memory devices. Such storage of the data makes it impossible to store in spare memory cells information that corresponds to that information in defective memory cells since testing that determine which cells are defective does not occur until after the fabrication process is completed. Accordingly, when redundancy is used in the Mask ROM, it is required to use spare memory cells which are separated from the normal memory cells in order to make it possible to store information after completion of the initial process. The Mask ROM spare memory cells used are those having floating gates such as are employed in PROMs and memory cells having fuses.

There is an advantage to using redundancy rather than ECC relief defect techniques because it can occupy a smaller area. However, one disadvantage is that after addresses are applied to the chip, whether the addresses designate defective memory cells must be determined. Accessing addresses of the spare memory cells thus undesirably causes the access time to be increased.

Also, page mode operation, which sequentially outputs a stream of data after once reading this stream of data which corresponds to several words in order to shorten the access time, requires using the same number of spare memory cells as number of words read in order to repair one defective memory cell. Since a Mask ROM requires the use of spare memory cells which are separated from the normal memory cells, the spare memory cells needed undesirably occupy an excessively large chip area. Also, using a redundancy technique together with an ECC technique in order to improve yield gives rise to the above-referenced difficulties and problems.

SUMMARY OF THE INVENTION

Accordingly, an object of the present invention is to provide a redundancy circuit and method of operation a semiconductor memory device which reduces delay of access time by storing data in spare memory cells which can be output via a data output buffer without a sense amplifier to prevent increased access time of the memory cells in a Mask ROM.

Another object of the present invention is to provide a redundancy circuit and method of operating a semiconductor memory device which can achieve high yield and use a small area irrespective of whether page mode operation and an ECC repair technique is used.

Still another object of the present invention is to provide a redundancy circuit and method of operating a semiconductor memory device which connects with a data output buffer to spare memory cells holding correction data which correspond to the addresses designating defective addresses, and which disconnects with the data output buffer from a sense amplifier which senses data stored in normal memory cells at this time.

These objects and other objects of the present invention are achieved by providing a redundancy circuit in a semiconductor memory device which has spare memory cells which can store information that can be substituted for data of defective memory cells after the completion of the manufacturing process. If addresses designating the defective memory cells are externally input, the redundancy circuit generates a defective cell relief address signal which corresponds to the address designating the defective memory cell and is used to prevent defective data stored in normal memory cells from being output and causes correction data, to be substituted for the defective data output in correspondence with the defective cell relief address.

BRIEF DESCRIPTION OF THE DRAWINGS

The following is a detailed description of the invention by the reference of their attached drawings, in which like numbers indicate the same or similar elements.

DETAILED DESCRIPTION OF THE PREFERRED EMBODIMENT

Figure 1:
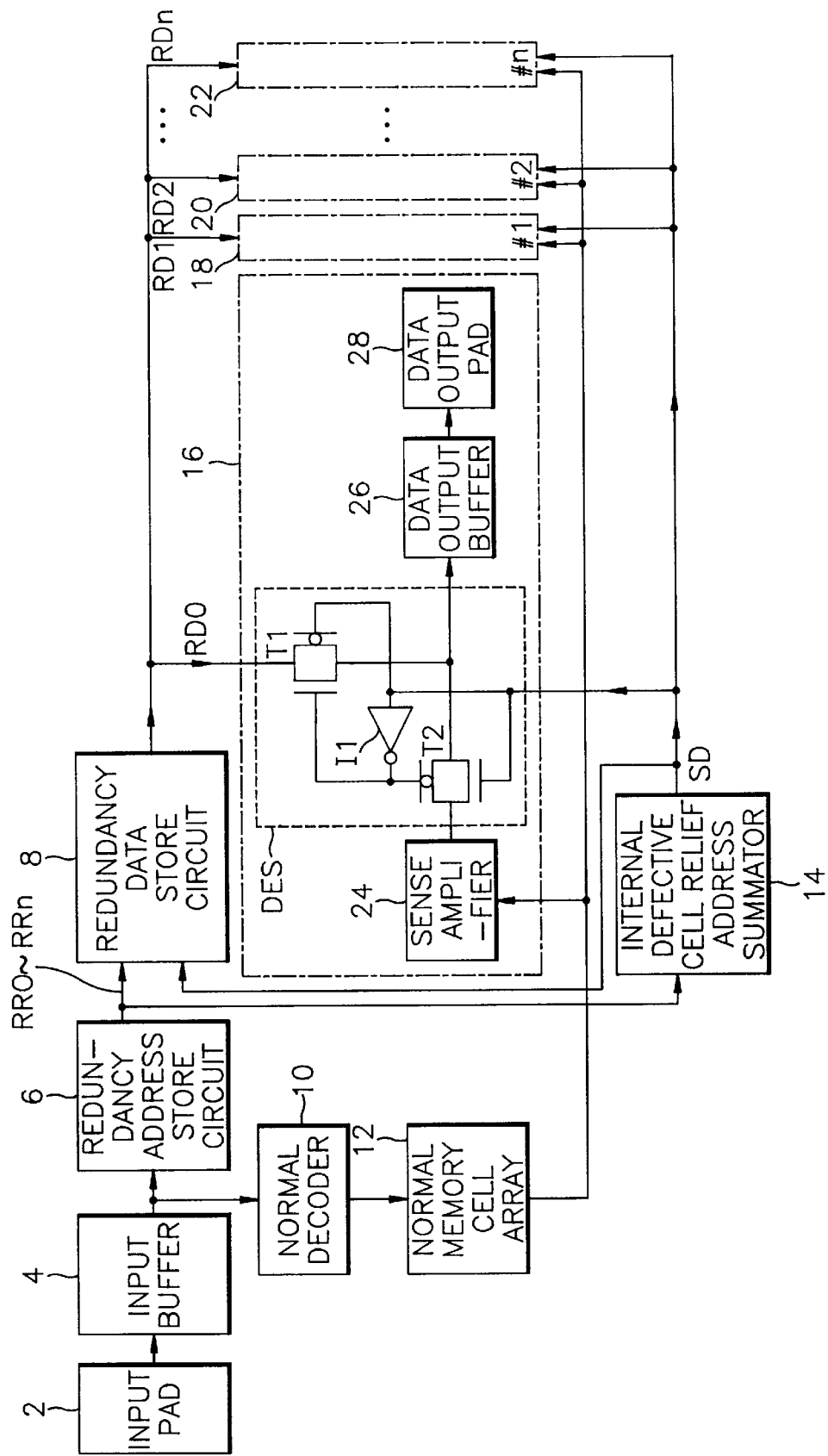
FIG. 1 is a schematic block diagram of a semiconductor memory device according to the present invention.

FIG. 1 is a schematic block diagram of a semiconductor memory device according to the present invention.

A semiconductor memory device shown in FIG. 1 includes an input pad 2 for inputting external addresses. An input buffer 4 buffers the addresses output from the input pad 2 and a normal decoder 10 decodes the addresses output from the input buffer 4. A normal memory cell array 12 has a plurality of normal memory cells, each of which are selected using a normal decoding signal output from the normal decoder 10. A redundancy address store circuit 6 generates defective cell relief address signals RR0–RRn corresponding to defect designation addresses. These addresses are originally obtained from input buffer 4 so that the defect designation addresses which designate defective memory cells among the normal memory cells can be memorized. A defective cell relief address signal summator 14 inputs the defective cell relief address signals RR0–RRn output from the redundancy address store circuit 6 to thereby generate a path selecting signal SD when any one address among the internal defective cell relief address signals RR0–RRn is activated. A redundancy data store circuit 8 inputs the defective cell relief address signals RR0–RRn which are output from the redundancy address store circuit 6, and is controlled by the path selecting signal SD and outputs correction data RD0–RDn which can be substituted in correspondence with the defective cell relief addresses for defective data that is obtained from the normal memory cells. A sense amplifier 24 senses data output from the normal memory cell array 12 and a data output path select circuit DES selectively connects either an output of the sense amplifier 24 or correction data RD0–RDn output from the redundancy data store circuit 8 to a data output buffer 26. Data output path select circuit DES includes an inverter I1 and first and second transmission gates T1 and T2, and is controlled by path selecting signal SD output from the internal defective cell relief address summator. A plurality of data output circuits 16,18,20, . . . , 22, each of which has a data output pad 28, transmits data output from the data output buffer 26.

In the above described semiconductor memory device of FIG. 1 having spare memory cells which store information that can be substituted for data of defective memory cells after completion of the initial manufacturing process, the redundancy address store circuit 6 generates the defective cell relief addresses which correspond to the addresses designating defective memory cells input from the exterior of the chip. Data stored in normal memory cells which is defective is cut off as a result of the generated defective cell relief addresses and an identical number of unit data bits or an integer multiple of these unit data bits from the spare memory cells substituted.

In other words, in the semiconductor memory device shown in FIG. 1, the redundancy address store circuit 6 generates the defective cell relief address signals RR0–RRn when addresses designating defective memory cells in advance are externally input. A data transmission path from the sense amplifier 24 to the data output buffer 26 is cut off when data path selecting signal SD, which is output from the defective cell relief address signal summator 14 is present to indicate a defective cell address was detected. Data corresponding to the same external addresses is then selected from the redundancy data store circuit 8 and output to the data output buffer 26 through the data output path select circuit DES so that correct data is obtained.

If addresses not corresponding to defective memory cells are input, the redundancy address store circuit 6 detects that no correspondence of addresses exist and normal operation takes place. Sense amplifier 24 thus senses data stored in an addressed memory cell within the normal memory cell array 12 and transmits the sensed data to the data output buffer 26. Redundancy data store circuit 8 does not get used and is not connected to the data output buffer 26.

In the configuration shown in FIG. 1, if the external addresses corresponding to defective addresses are applied, data set to logic "high" state or "low" state and stored in the redundancy data store circuit 8 is directly output from the data output buffer 26 without any sense amplifier sensing the spare memory cells. Thus, a further delay in access time of the spare memory cells is eliminated.

A further advantage of the semiconductor memory device shown in FIG. 1 is that only the number of the spare memory cells identical to the number of output pins for one defective address is provided irrespective of whether page mode and ECC techniques are used, so that the redundancy circuit can be configured in a small area.

Figure 2:
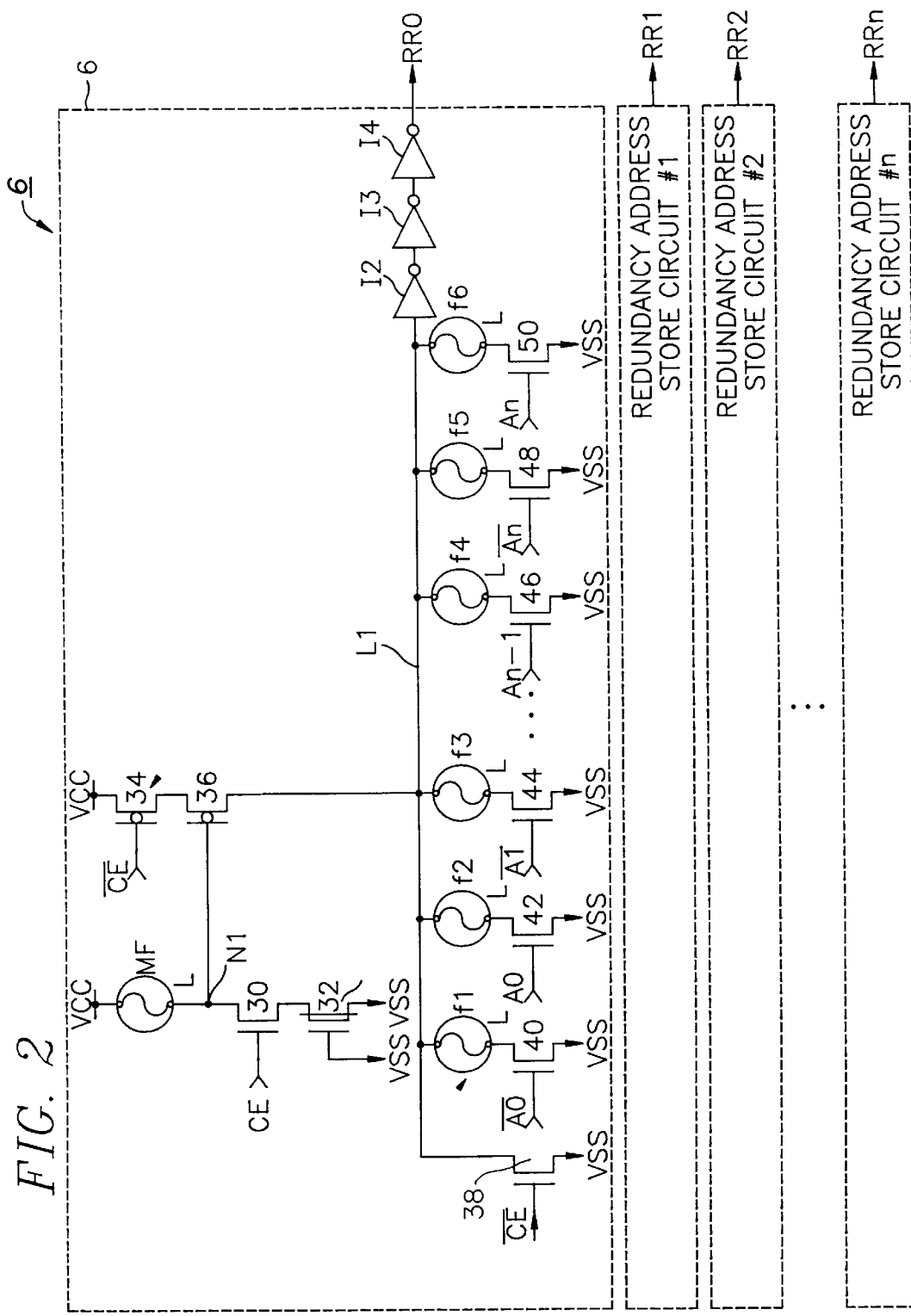
FIG. 2 is a detailed circuit diagram illustrating the redundancy address store circuit of FIG. 1.

FIG. 2 is a detailed circuit diagram illustrating the redundancy address store circuit 6 of FIG. 1. The redundancy address store circuit 6 shown in FIG. 2 includes a master fuse MF which is connected between a power supply voltage VCC and a control node N1. An N-channel type first transmission transistor 30 having a drain terminal connected to the control node N1 and a gate terminal connected to a chip selecting signal CE controls stand-by/operation states of the memory device. A depletion type transistor 32 has a drain terminal connected to a source terminal of the first transmission transistor 30 and a source terminal and a gate terminal that are commonly connected to a ground voltage VSS and is used as a resistor. A resistor can also be used. A P-channel type second transmission transistor 34 has a source terminal connected to the power supply voltage VCC and a gate terminal connected to inverted chip select signal $\overline{CE}$. A P-channel type third transmission transistor 36 has a source terminal connected to a drain terminal of the second transmission transistor 34, a drain terminal connected to conductive path L1, and gate terminal connected to the control node N1. An N-channel type fourth transmission transistor 38 has a drain terminal connected to the conductive path L1, a gate terminal connected to the inverted chip select signal $\overline{CE}$ and source terminal connected to the ground voltage VSS. A first fuse group, with two fuses for each address input are designated in FIG. 2 as f1,f2, . . . , and f6, each fuse having one terminal connected to the conductive path L1. N-channel type address input transistors 40,42 . . . , 48, and 50 are each connected between the other terminal of one fuse from the first fuse group and the ground voltage VSS, and have addresses $\overline{A0}$, A0, . . . , $\overline{An}$, and An respectively input to gate terminals thereof.

With the redundancy address store circuit illustrated in FIG. 2, if an address corresponding to a defective memory cell is input when the memory device is in stand-by state, the chip selecting signal CE which controls the stand-by/ operation states of the memory device prevent selection during an improper time period since CE is applied to fourth transmission transistor 38, and thus prevent an internal path to which the internal defective cell relief addresses are input from being in a floating state.

In the redundancy address store circuit 6 shown in FIG. 2, the addresses designating the defective memory cells are input to the gate terminals of the address input transistors 40,42, . . . , 50 which are respectively connected to the fuses f1,f2, . . . , and f6, so that the fuse connected to the N-channel type transistors to which an address "1" is input are cut. Further master fuse MF is cut to designate that use of that particular redundancy address circuit 6, which causes the second and third transmission transistors 34 and 36 to be turned on to set a logic "high" state signal to the conductive path L1 when a corresponding defective cell relief address is input at the proper time, and an internal defective cell relief address signal RR0 which is in the logic "low" state is generated through inverters I2,I3 and I4.

Figure 3:
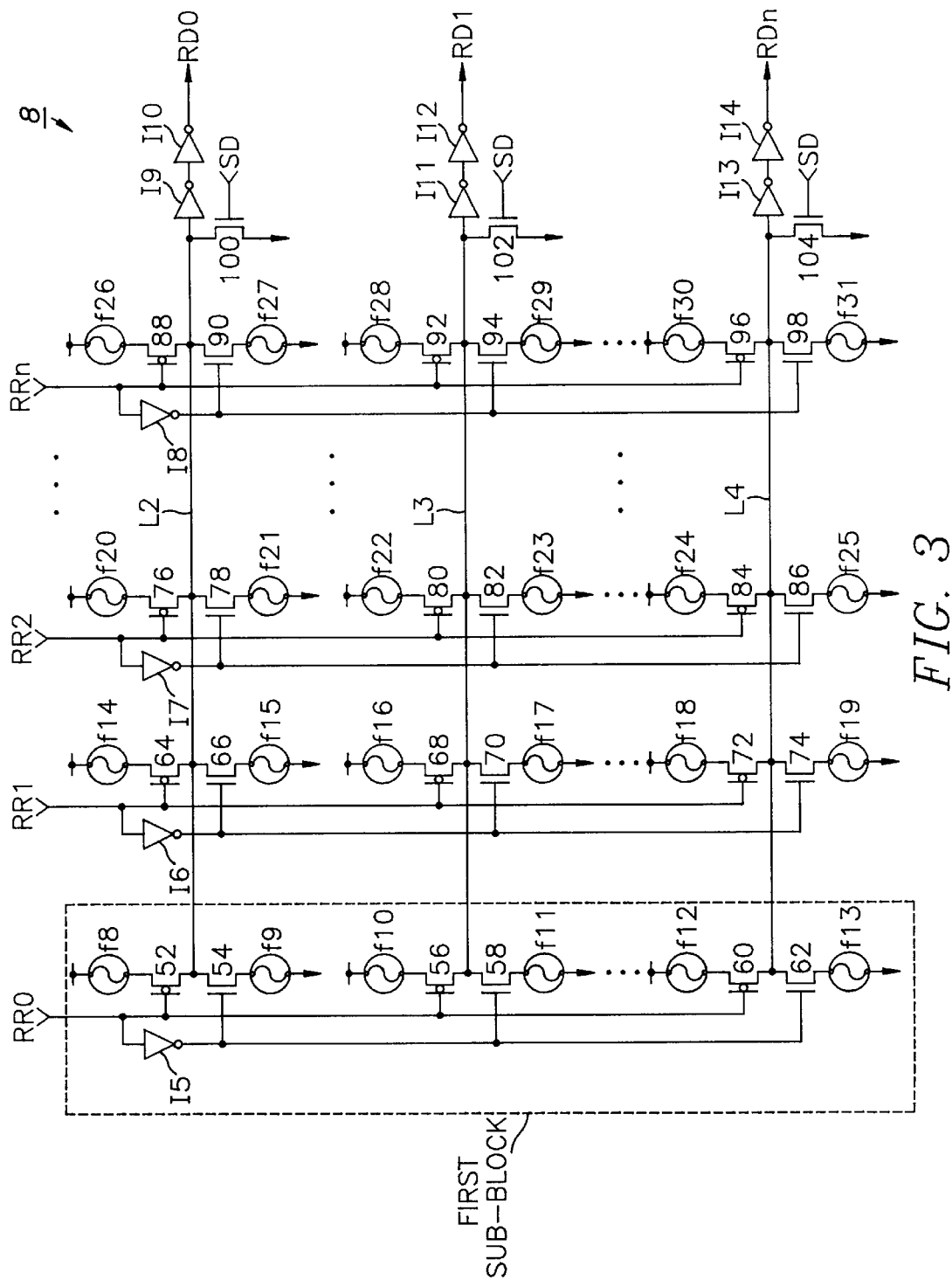
FIG. 3 is a detailed circuit diagram illustrating the redundancy data store circuit of FIG. 1.

FIG. 3 is a detailed circuit diagram illustrating the redundancy data store circuit 8 of FIG. 1. The redundancy data store circuit 8 shown in FIG. 3 includes in the first sub-block an inverter I5 for inputting and inverting the internal defective cell relief address signal RR0. A first fuse group designated f8,f10, . . . , and f12 one terminal of each fuse connected to the power supply voltage VCC. A second fuse group designated f9,f11, . . . , f13 20 has one terminal of each fuse connected to the ground voltage VSS. A transmission transistor group which is comprised of the P-channel type transmission transistors 52,56, . . . , 60 and N-channel type transmission transistors 54,58, . . . , 62 connects serially between each fuse of the first and second fuse groups. Additional sub-blocks having the same fuse groups and transmission transistor group are in-parallel extended and connected together on the conductive paths L2,L3, . . . , L4 via a common node shared by the P-channel type transmission transistors and the N-channel type transmission transistors. The rest of the internal defective cell relief address signals RR1–RRn are input to each additional sub-block. As a result, correction data RD0–RDn can be generated and substituted for the defective data corresponding to the internal defective cell relief address signals RR0–RRn.

The configuration of the redundancy data store circuit 8 shown in FIG. 3 will be described in more detail. The redundancy data store circuit 8 in FIG. 3 comprises a first sub-block having the fuses designated f8,f10, . . . , and f12 each of which one terminal connected to the power supply voltage VCC. The P-channel type transistors designated 52,56, . . . , and 60 each have a source terminal connected to the other terminal of one of the fuses designated f8, f10, . . . , and f12, a gate terminal respectively connected to the defective cell relief address RR0, and drain or source terminals are respectively connected to one of the conductive paths L2,L3, . . . , and L4. The N-channel type transistors designated 54,58, . . . , and 62 each has a drain terminal connected to one of the conductive paths L2, L3, . . . , L4 and a gate terminal connected to an output terminal of the inverter I5. Fuses designated f9, f11 . . . , and f13 are each connected between source terminals of one of the N-channel type transistors designated 54,58, . . . , and 62 and the ground voltage VSS.

The plurality of sub-blocks, having the same configuration as the first sub-block and being connected in parallel to each other in an extending direction as described above, each input one of the defective cell relief address signals RR0–RRn. Inverters designated I9,I10, . . . , and I14 and discharging transistors designated 100,102, . . . , and 104 which are controlled by the path selecting signal SD are respectively provided between each of conductive paths L2,L3, . . . , and L4 and the ground voltage VSS to allow generation and output of correction data RD0–RDn which can be substituted for defective data.

In the redundancy data store circuit 8 shown in FIG. 3, if the internal defective cell relief address signal RR0 which is in the logic "low" state is input to the first sub-block, the P-channel type transistors 52,56, . . . , and 60 and the N-channel type transistors 54,58, . . . , and 62 of the first sub-block are all turned on. If the fuse f9 is cut and the fuse f8 is not cut, correction data RD0 which can be substituted for the defective data in correspondence with the defective cell relief address signal RR0, the correction data RD0 being in the logic "high" state in the example provided is generated through the inverters I9 and I10. When only a single defective cell is being substituted, the rest of the fuses f10, f11, f12, and f13 within the first sub-block are not cut, and the power supply voltage VCC is discharged to the ground voltage VSS through them.

Correction data RD1–RDn corresponding to the internal defective cell relief address signals RR1–RRn are easily generated by the fuse cutting operation as described above.

Figure 4:
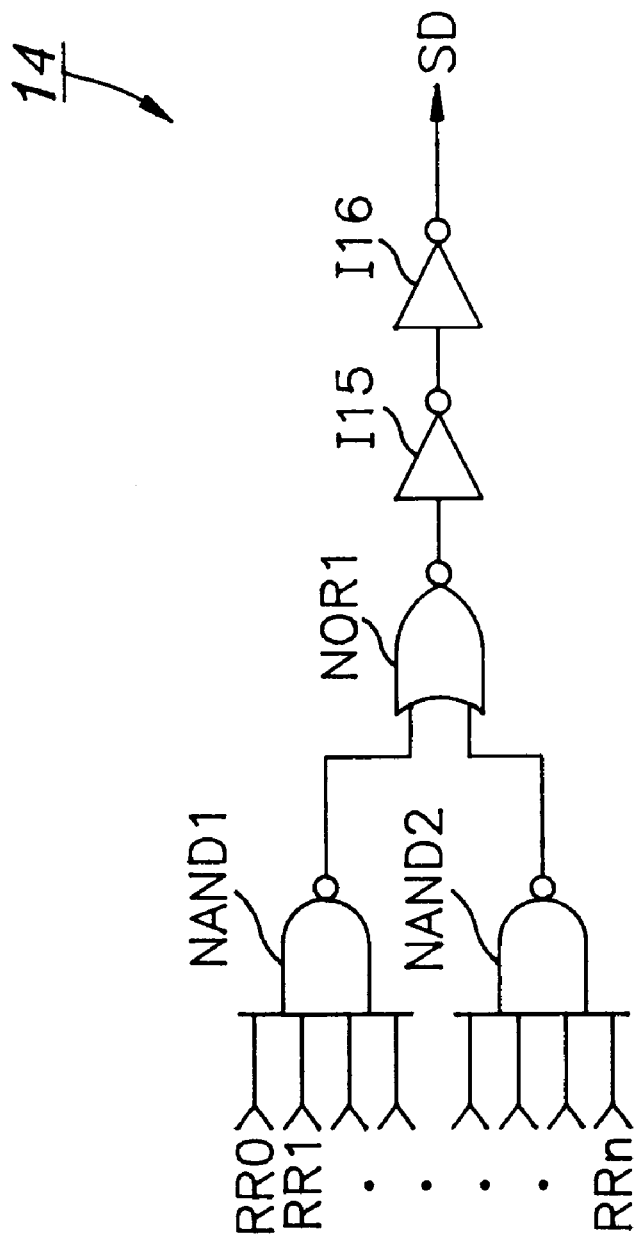
FIG. 4 is a detailed circuit diagram illustrating the internal defective cell relief address signal summator of FIG. 1.

FIG. 4 is a detailed circuit diagram illustrating the defective cell relief address signal summator 14 of FIG. 1. The defective cell relief address signal summator 14 shown in FIG. 4 comprises NAND gates NAND1 and NAND2 to which the defective cell relief address signals RR0–RRn are input. A NOR gate NOR1 receives the output signals of the NAND gates NAND1 and NAND2. An inverter I15 inputs and inverts an output signal of the NOR gate NOR1 and an inverter I16 inputs an output signal of the inverter I15 to generate the path selecting signal SD. As illustrated in FIG. 1, the path selecting signal SD controls the transfer gates T1 and T2, to thereby disconnect the sense amplifier 24 and the data output buffer 26 and connect the redundancy data store circuit 8 and the data output buffer 26 if the addresses corresponding to defective memory cells are input.

Operation of the semiconductor memory device according to the present invention will now be in more detail described with reference to FIG. 1 to FIG. 4. The redundancy address store circuit 6 according to FIG. 2 stores a plurality of addresses corresponding to locations of defective memory cells within the normal memory cell array. The redundancy data store circuit 8 according to FIG. 3 stores the data in correct form that is destroyed in the corresponding normal memory cell. The defective cell relief address signals RR0–RRn output from the redundancy address store circuit according to FIG. 2 are activated when an address designating a defective memory cell is applied to the chip, and the correction data RD0–RDn is substituted for the defective data stored in the normal memory cell.

The internal defective cell relief address signal summator 14 according to FIG. 4 selectively determines the data output path. Either the redundancy data store circuit 8 and the data output buffer 26 are connected, or the sense amplifier 24 and the data output buffer 26 are connected. The path selecting signal SD generated from the defective cell relief address signal summator 14 is not activated when the defective cell relief address signals RR0–RRn are not generated during a non-activated state so that a floating node within the redundancy data store circuit 8 is eliminated during a non-activated state, the output of the sense amplifier 24 is input to the data output buffer 26 and the path selecting signal SD in the logic "high" state will turn off the first transfer gate T1 and to turn on the second transfer gate T2 so that the sense amplifier 24 and the data output buffer 26 are connected each other.

The path selecting signal SD generated from the internal defective cell relief address signal summator 14 is activated when any one of the defective cell relief address signals RR0–RRn is activated, so that the sense amplifier 24 and the data output buffer 26 are disconnected and the redundancy data store circuit 8 and the data output buffer 26 are connected each other. The path selecting signal SD will then be in the logic "low" state so that the first transfer gate T1 is turned on and the second transfer gate T2 is turned off.

In the semiconductor memory device illustrated in FIG. 1, the memory device performs normal operations using the addresses input unless the redundancy address store circuit 6 determines that an input address corresponds to one of the addresses stored within the redundancy address store circuit 6 and which designate a defective memory cell.

The present invention can also be used, if desired, with a single address outputting more than 1 bit of data. If so used, then data for that number of bits can be read out using that number of memory cells within a single sub-block of FIG. 3. Thus, a certain number of bits will be addressed at the same time and this number of bits of data can be stored within a single sub-block of FIG. 3.

While there have been illustrated and described what are considered to be preferred embodiments of the present invention, it will be understood by those skilled in the art that various changes and modifications may be made, and equivalents may be substituted for elements thereof without departing from the true scope of the present invention.

What is claimed is:

1. A redundancy circuit of a semiconductor memory device which stores data in a normal memory array during manufacture and contains a sense amplifier for sensing said data from said normal memory array prior to said data being output to a data output buffer, said redundancy circuit comprising:

an array including a plurality of spare memory cells which can be permanently programmed subsequent to said manufacture with correction data;

a defective cell address detector which detects the presence of a defective cell address, each said defective cell address corresponding to a single defective normal memory cell; and a switch circuit which connects said at least one of said plurality of spare memory cells to said data output buffer and disconnects said normal memory cells from said data output buffer when said defective cell address detector detects the presence of said defective cell address so that said correction data can be output.

2. A redundancy circuit according to claim 1 wherein said switch circuit connects said at least one of said plurality of spare memory cells to said data output buffer without said correction data being sensed by any sense amplifier, including said sense amplifier, prior to being input to said data output buffer.

3. A redundancy circuit according to claim 1 wherein said defective cell address detector includes:

a redundancy decoder capable of detecting the presence of a plurality of defect cell addresses and outputting on a plurality of defective cell address output lines a corresponding plurality of defective cell address signals; and a summator connected to each of said plurality of defective cell address output lines which generates a path select signal when any one of said plurality of defective cell address signals is detected; and wherein said switch circuit inputs said path select signal to control said connection of said at least one of said plurality of spare memory cells to said data output buffer and said disconnection of said normal memory cells from said data output buffer.

4. A redundancy circuit according to claim 3 wherein said switch circuit connects said at least one of said plurality of spare memory cells to said data output buffer.

5. A redundancy circuit according to claim 3 wherein each of said defective cell address output lines is connected to said array and each of said defective cell address signals causes output of correction data from a corresponding spare memory cell.

6. A redundancy circuit according to claim 5 wherein at least one of said defective cell address signals causes output of correction data from a corresponding plurality of spare memory cells.

7. A semiconductor memory device comprising:

a normal decoder which inputs and decodes external addresses to generate a plurality of normal decoding signals corresponding thereto;

a normal memory cell array having a plurality of normal memory cells containing data which is stored during manufacture of said semiconductor device, each of said plurality of normal memory cells being accessed by a correspondingly normal decoding signal output from said normal decoder;

a redundancy address storage circuit which inputs and decodes said external addresses to generate defective cell address signals, each defective cell address signal corresponding to a single defective memory cell which produces defective data in said normal memory array;

a summator which inputs said defective cell address signals to generate a path selecting signal;

a spare memory cell array having a plurality of spare memory cells, each of said plurality of spare memory cells being accessed by one of said defective cell address signals so that correction data in corresponding spare memory cells can be substituted for corresponding defective data produced by corresponding defective memory cells, said spare memory cell array including a spare memory cell array data output line;

a sense amplifier for sensing data output from said normal memory cell array and outputting said sensed data to a sense amplifier output line;

a data output buffer; and a data output path selecting circuit for selectively connecting one of said sense amplifier output line and said spare memory cell array data output line to said data output buffer in correspondence with said path selecting signal so that said sense amplifier and said data output buffer are disconnected and said correction data is output to said data output buffer without being sensed by said sense amplifier.

8. A semiconductor memory device according to claim 7 wherein said redundancy address storage circuit includes a plurality of defective address storage circuits, each defective address storage circuit including:

a master fuse connected between a power supply voltage and a control node;

an N-channel first transmission transistor having a first drain terminal connected to said control node and first gate terminal connected to a chip select signal which controls stand by and operating states of said memory device;

a P-channel second transmission transistor having a second source terminal connected to said power supply voltage and a second gate terminal connected to an inverted chip select signal;

a P-channel third transmission transistor having a third source terminal connected to said second drain terminal, a third drain terminal connected to a conductive path, and a third gate terminal connected to said control node;

an N-channel fourth transmission transistor having a fourth drain terminal connected to said conductive path, a fourth gate terminal connected to said inverted chip select signal, and a fourth source terminal connected to a ground voltage;

a first fuse group including a plurality of fuses, each fuse having a first terminal connected to said conductive path and a second terminal; and a plurality of N-channel address input transistors, each of which are connected between the said second terminal of one of said fuses of said first fuse group and said ground voltage, and having an address input gate terminal which receives one address bit of each said external address, each of said fuses capable of being cut so that when a defective cell address is input, one of said defective cell address signals is generated.

9. A semiconductor memory device according to claim 8 further including a resistance connected between said first source terminal of said first transmission transistor and said ground voltage.

10. A semiconductor memory device according to claim 7 wherein said spare memory cell array includes a plurality of sub-blocks, each sub-block including:

a first fuse group including a plurality of first fuses each having first and second terminals, each of said first terminals connected to said power supply voltage;

a second fuse group including a plurality of second fuses each having first and second terminals, each of said first terminals connected to said ground voltage;

a transmission transistor group including a plurality of P-channel transmission transistors and N-channel transmission transistors, each of said P-channel transmission transistors connected between one of said second terminals of one of said first fuses and a common node and having a p-channel transistor gate terminal controlled by said one of said defective cell address signals and each of said N-channel transmission transistors connected between one of said second terminals of one of said second fuses and said common node and having an n-channel transistor gate terminal controlled by an inverted one of said one defective cell address signal;

one of said plurality of first fuses, second fuses, P-channel transmission transistors and N-channel transmission transistors included in one of said spare memory cells and having one of said common nodes, each said one of said first and second fuses being breakable to establish correction data corresponding to said one defective cell address signal; and a plurality of data output lines which connect together said plurality of sub-blocks, each data output line electrically connecting one of said common nodes in each of said sub-blocks.

11. A semiconductor memory device according to claim 7, wherein said summator includes:

first and second NAND gates which input said defective cell address signals and output first and second NAND gate outputs, respectively; and a NOR gate which receives said first and second NAND gate outputs to generate said path selecting signal.

12. A redundancy method for use in a semiconductor memory device which stores data in a normal memory array during manufacture and contains a sense amplifier for sensing said data from said normal memory array prior to said data being output to a data output buffer, said redundancy method comprising the steps of:

permanently programming subsequent to said manufacture in a spare memory cell array a plurality of spare memory cells with correction data;

permanently programming subsequent to said manufacture in a defective cell address detector a plurality of redundant cell addresses each of which correspond to a defective cell address of a single defective memory cell in said normal memory array;

in use, detecting the presence of said defective cell addresses by inputting external addresses to said defective cell address detector to generate defective cell address signals which each correspond to the detection of one of said redundant cell addresses; and in use, outputting said correction data instead of data from said normal memory cells when said defective cell address signals are generated by disconnecting said normal memory array from said data output buffer and connecting said spare memory cell array to said data output buffer.

13. A redundancy method according to claim 12 wherein during said step of outputting said correction data, said data output buffer is disconnected from said normal memory array using a switch circuit controlled by a path select signal generated from said defective cell address signals.

14. A redundancy method according to claim 13 wherein during said step of outputting said correction data, said switch circuit disconnects said data output buffer from said sense amplifier.

15. A redundancy method according to claim 12 wherein during said step of outputting said correction data, said correction data is not amplified by any sense amplifier, including said sense amplifier, prior to being input to said data output buffer.

16. A redundancy method for use in a semiconductor memory device which stores data in a normal memory array during manufacture and stores correction data which can be substituted for defective data in stored in defective memory cells of said normal memory array, said redundancy method comprising the steps of:

decoding an external address for addressing a normal memory cell in said normal memory cell array; and detecting whether said external address corresponds to defective addresses of defective data stored in said defective memory cells and generating defective address signals when such correspondence is determined;

summating said defective address signals to generate a path select signal;

outputting correction data along a spare memory cell array output from said spare memory cell array using said defective address signals;

sensing data output from said normal memory cell array and outputting said data to a sense amplifier output; and selecting a data output path selectively connecting one of said sense amplifier output and said spare memory cell array output to a data output buffer in correspondence with said path select signal so that said sense amplifier and said data output buffer are disconnected and said correction data is output to said data output buffer without being sensed by said sense amplifier.

* * * * *